US009406355B1

(12) United States Patent
Chang et al.

(10) Patent No.: US 9,406,355 B1
(45) Date of Patent: Aug. 2, 2016

(54) SENSE AMPLIFIER

(71) Applicant: National Tsing Hua University, Hsinchu (TW)

(72) Inventors: Meng-Fan Chang, Taichung (TW); Yu-Lin Chen, Tainan (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/740,288

(22) Filed: Jun. 16, 2015

(51) Int. Cl.
*G11C 7/12* (2006.01)
*G11C 7/08* (2006.01)
*G11C 5/10* (2006.01)

(52) U.S. Cl.
CPC ... *G11C 7/08* (2013.01); *G11C 5/10* (2013.01)

(58) Field of Classification Search
CPC .............................. G11C 13/0069; G11C 7/12
USPC ........................................ 365/189.011, 203
See application file for complete search history.

(56) References Cited

U.S. PATENT DOCUMENTS

| 6,147,895 | A  | * | 11/2000 | Kamp ..................... | G11C 11/22 365/117 |
| 6,373,753 | B1 | * | 4/2002  | Proebsting ............. | G11C 5/145 257/E21.659 |
| 6,473,330 | B1 | * | 10/2002 | Ogiwara ................. | G11C 11/22 365/145 |
| 6,751,152 | B2 |   | 6/2004  | Hsu et al. | |
| 7,099,216 | B2 |   | 8/2006  | Luk et al. | |
| 8,320,190 | B2 | * | 11/2012 | Lueng ................... | G11C 11/404 365/185.21 |
| 8,391,078 | B2 | * | 3/2013  | Leung .................. | G11C 11/404 365/185.05 |
| 8,873,321 | B2 | * | 10/2014 | Katoch ................. | G11C 11/417 365/203 |

FOREIGN PATENT DOCUMENTS

| CN | 101533668 | 9/2009 |
| TW | I265519 | 11/2006 |

* cited by examiner

*Primary Examiner* — Michael Tran
(74) *Attorney, Agent, or Firm* — Jianq Chyun IP Office

(57) ABSTRACT

The present disclosure provides a sense amplifier. The sense amplifier includes a first inverting circuit, a second inverting circuit, a capacitor, and a write-back path circuit. The first inverting circuit has a first input end and a first output end, and the first input end receives a first bit line signal from a memory cell. The second inverting circuit has a second input end and a second output end, wherein the second input is coupled to the first output end, and the second output end is coupled to the first input end, and the second input end receives a second bit line signal from the memory cell. The capacitor receives a boost signal and generates a boosted voltage according to the boost signal during a write-back timing period. The write-back path circuit transports the boosted voltage to one of the first and second input ends during the write-back timing period.

9 Claims, 2 Drawing Sheets

SENSE AMPLIFIER

BACKGROUND OF THE INVENTION

1. Field of Invention

The present invention generally relates to a sense amplifier, and more particularly to the sense amplifier with a write back scheme.

2. Description of Prior Art

Along with the rapid development of science and technology at the present, electronic apparatus becomes a popular tool for people. In an electronic apparatus, semiconductor memories are widely used for storing information. For low power consumption issue, a semiconductor memory with a low voltage operation power is necessary.

In conventional art, when a dynamic random access memory cell is selected for read, a storage stored in the selected memory may be loss caused by interference from other memory cells. Especially in the memory cells with the low voltage operation power, data stored in the selected memory cell may be changed caused by the charge loss of the memory cell. For overcoming the problem above, a write back scheme is necessary for the semiconductor memory.

SUMMARY OF THE INVENTION

The present disclosure provides a sense amplifier for improving performance of reading operation on a memory cell.

The present disclosure provides a sense amplifier. The sense amplifier includes a first inverting circuit, a second inverting circuit, a capacitor, and a write-back path circuit. The first inverting circuit has a first input end and a first output end, and the first input end receives a first bit line signal from a memory cell. The second inverting circuit has a second input end and a second output end, wherein the second input is coupled to the first output end, and the second output end is coupled to the first input end, and the second input end receives a second bit line signal from the memory cell. The capacitor receives a boost signal and generates a boosted voltage according to the boost signal during a write-back timing period. The write-back path circuit is coupled to the capacitor and transports the boosted voltage to one of the first and second input ends during the write-back timing period.

According to an embodiment of present disclosure, wherein the write-back path circuit includes a first and second switches. The first switch is coupled between the capacitor and the second input end, and the first switch is controlled by the first bit line signal to be turned on or cut off. The second switch is coupled between the capacitor and the first input end, and the second switch is controlled by the second bit line signal to be turned on or cut off.

According to an embodiment of present disclosure, wherein the first bit line signal and the second bit line signal are complementary during the write-back timing period, and on-off status of the first and second switches are complementary during the write-back timing period.

According to an embodiment of present disclosure, wherein the first switch includes a first transistor. The first transistor has a first end, second end, and control end, wherein the first end of the first transistor receives the boosted voltage, the second end of the first transistor is coupled to the second input end, and the control end of the first transistor receives the first bit line signal. The second switch includes a second transistor. The second transistor has a first end, second end, and control end, wherein the first end of the second transistor receives the boosted voltage, the second end of the second transistor is coupled to the first input end, and the control end of the first transistor receives the second bit line signal.

According to an embodiment of present disclosure, the sense amplifier further includes a first power path switch and a second power path switch. The first power path switch is coupled between ground ends of the first and second inverting circuit and a reference ground, and controlled by a sense enable signal for being turned on or cut off. The second power path switch is coupled between power receiving ends of the first and second inverting circuit and an operation power, and controlled by an inverted sense enable signal for being turned on or cut off.

According to an embodiment of present disclosure, wherein during a charge sharing timing period of a reading timing period, the first and second power path switches and the first and second switches are cut off, during a data sensing timing period of the reading timing period, the first and second power path switches are turned on and merely one of the first and second switches is turned on, during the write-back timing period of the reading timing period, the first and second power path switches are cut off, and the boosted voltage is provided to one of the first and second bit line signal to be written back to the memory cell.

According to an embodiment of present disclosure, wherein the charge sharing timing period is before the data sensing timing period, and the data sensing timing period is before the write-back timing period.

According to an embodiment of present disclosure, wherein a voltage level of the boost signal is boosted from a first voltage to a second voltage level during the wire-back timing period, wherein the second voltage level is larger than the first voltage level.

According to an embodiment of present disclosure, wherein the first inverting circuit includes a first transistor and a second transistor. The first transistor has a first end, second end, and a control end. The first end of the first transistor receives an operation power, the second end of the first transistor is coupled to the first output end, and the control end of the first transistor is coupled to the first input end. The second transistor has a first end, second end, and a control end. The first end of the second transistor is coupled to the second end of the first transistor, the second end of the second transistor is coupled to a reference ground, and the control end of the second transistor is coupled to the first input end. The second inverting circuit includes a third transistor and a fourth transistor. The third transistor has a first end, second end, and a control end. The first end of the third transistor receives the operation power, the second end of the third transistor is coupled to the second output end, and the control end of the third transistor is coupled to the second input end. The fourth transistor has a first end, second end, and a control end. The first end of the fourth transistor is coupled to the second end of the third transistor, the second end of the fourth transistor is coupled to the reference ground, and the control end of the fourth transistor is coupled to the second input end.

Accordingly, the sense amplifier provided by resent disclosure provides a write-back path circuit, and the write-back path circuit transporting a booted voltage to one of the first and second input ends during the write-back timing period. That is, the boosted voltage can be added to one of the first and second bit line signals, and a write-back operation on the memory cell can be operated. Further, by the write-back operation mentioned before, charge in the memory cell can be re-charged, and performance of the read operation can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
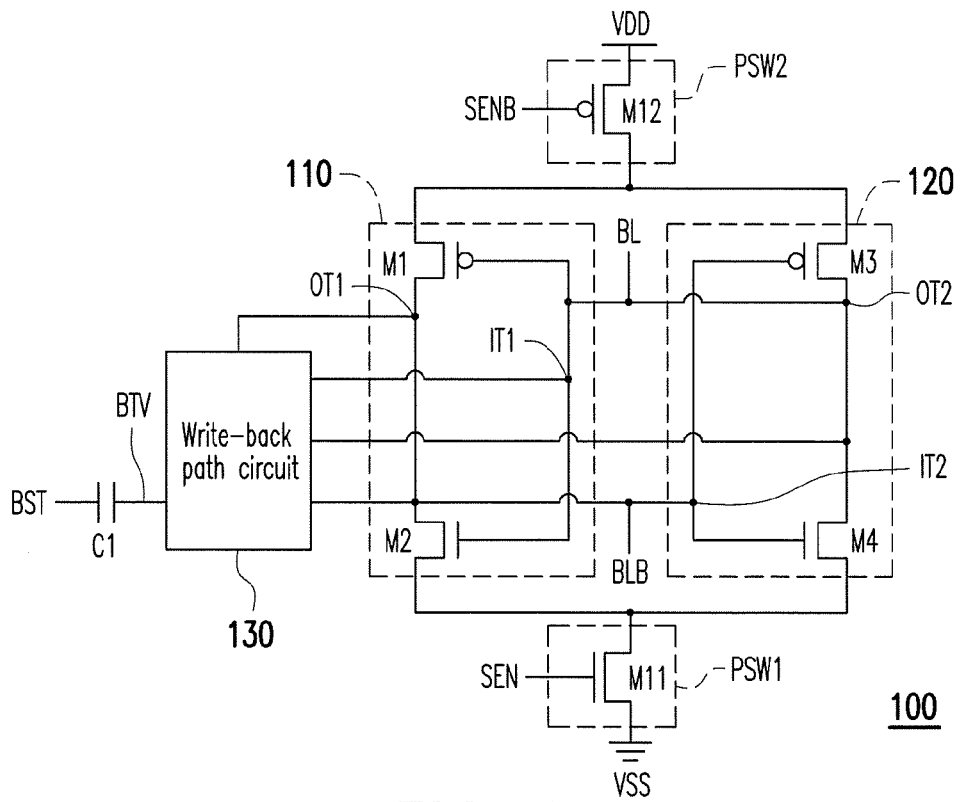
FIG. 1 is a circuit diagram of a sense amplifier according to an embodiment of the present disclosure.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 is a circuit diagram of a sense amplifier according to an embodiment of the present disclosure. The sense amplifier 100 includes a first inverting circuit 110, a second inverting circuit 120, a capacitor C1 and a write-back path circuit 130. The first inverting circuit 110 has a first input end IT1 and a first output end OT1, and the second inverting circuit 120 has a second input end IT2 and a second output end OT2. The first input end IT1 is coupled to the second output end OT2, and the second input end IT2 is coupled to the first output end OT1. The first input end IT1 may be used to receive a first bit line signal BL from a memory cell, and the second input end IT2 may be used to receive a second bit line signal BLB from the memory. Wherein, the memory cell may be one of a plurality of memory cells, and the memory cell is selected for a data read operation.

In detail, the first inverting circuit 110 includes transistor M1 and M2. A first end of the transistor M1 receives an operation power VDD through a power path switch PSW2, a second end of the transistor M1 is coupled to the first output end OT1, and a control end of the transistor M1 is couple to the first input end IT1. A first end of the transistor M2 is coupled to the second end of the transistor M1, a control end of the transistor M2 is coupled to the first input end IT1, and a second end of the transistor M2 is coupled to a reference ground VSS through a power path switch PSW1. Moreover, the second inverting circuit 120 includes transistor M3 and M4. A first end of the transistor M3 receives an operation power VDD through a power path switch PSW2, a second end of the transistor M3 is coupled to the second output end OT2, and a control end of the transistor M3 is couple to the second input end IT2. On the other hand, a first end of the transistor M4 is coupled to the second end of the transistor M3, a control end of the transistor M4 is coupled to the second input end IT2, and a second end of the transistor M4 is coupled to a reference ground VSS through a power path switch PSW1.

The write-back path circuit 130 is coupled to the first input end IT1, second input end IT2, first output end OT1, second output end OT2, and the capacitor C1. The write-back path circuit 130 receives the first and second bit line signals BL and BLB and transports a boosted voltage BTV to one of the first and second input ends IT1 and IT2 during the write-back timing period according to the first and second bit line signals BL and BLB. In the embodiment, the first and second bit line signals BL and BLB are complementary.

The boosted voltage BTV is generated by the capacitor C1. One end of the capacitor C1 receives a boost signal BST, and generates the boosted voltage BTV at another one end of the capacitor C1 during the write-back timing period. In detail, during the write-back timing period, a voltage level of the boost signal BST is boosted up from a first voltage level to a second voltage level (the second voltage level is higher than the first voltage level), and at the same time, a voltage level of the boosted voltage BTV is bumped up through the capacitor C1. The write-back path circuit 130 may transport the boosted voltage BTV which being bumped up to one of the first and second input ends IT1 and IT2.

It can be seen that by transporting the boosted voltage BTV to the first bit line signal BL or the second bit line signal BLB, the voltage level of one of the first and second bit line signal BL or BLB can be raise, and a write-back operation can be operated on the memory cell. Charges in the memory cell can be re-fresh, and data retention of the memory cell can be improved.

On the other hand, the power path switch PSW1 is coupled between ground ends of the first and second inverting circuit 110 and 120 and the reference ground VSS. The ground ends of the first and second inverting circuit 110 and 120 are respectively the second ends of the transistor M2 and M4. The power path switch PSW2 is coupled between the power receiving ends of the first and second inverting circuit 110 and 120 and the operation power VDD. The power receiving ends of the first and second inverting circuit 110 and 120 are respectively the first ends of the transistor M1 and M3.

The power path switch PSW1 and PSW2 are respectively formed by transistors M11 and M12. In this embodiment, the transistors M11 may be N-type MOS transistor, and the transistors M12 may be P-type MOS transistor. A gate of the transistor M11 receives a sense enable signal SEN, and the transistor M11 is turned on or cut off according to the sense enable signal SEN. A gate of the transistor M12 receives an inverted sense enable signal SENB, and the transistor M12 is turned on or cut off according to the sense enable signal SENB. The inverted sense enable signal SENB may be generated by inverting the sense enable signal SEN.

Figure 2:
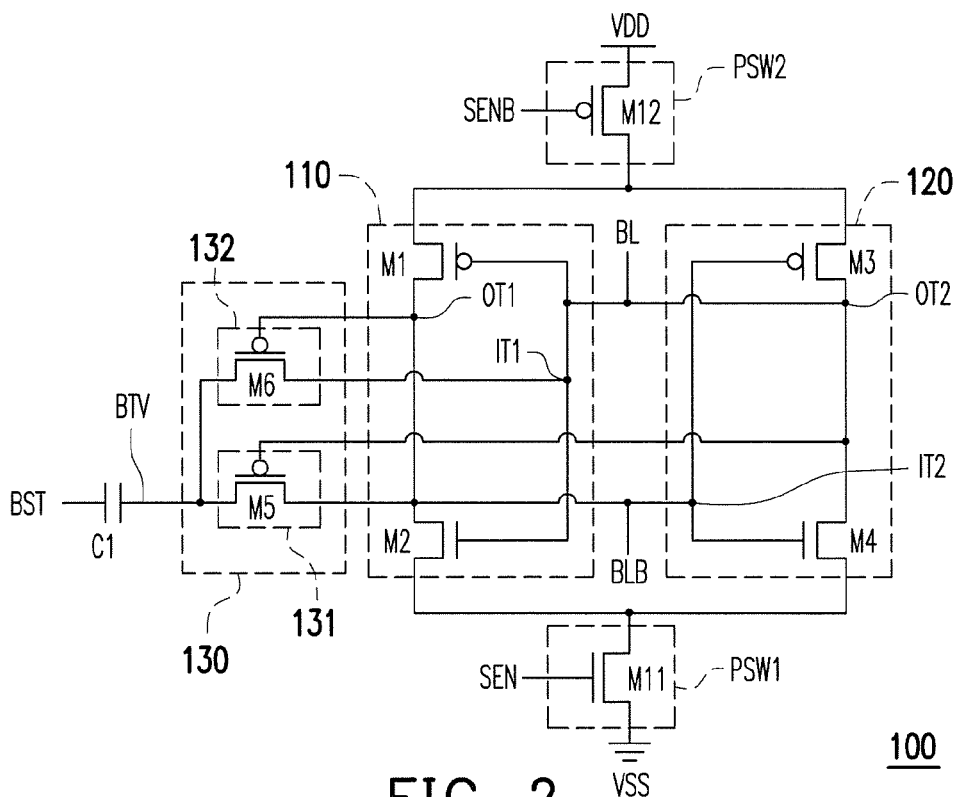
FIG. 2 is a circuit diagram of the sense amplifier 100 according to the embodiment in FIG. 1 of the present disclosure.

Referring to FIG. 2, FIG. 2 is a circuit diagram of the sense amplifier 100 according to the embodiment in FIG. 1 of the present disclosure. In FIG. 2, the write-back path circuit 130 includes switches 131 and 132. The switch 131 is coupled between the capacitor C1 and the second input end IT2, and controlled by the signal (the first bit line signal BL) applied on the second output end OT2. The switch 132 is coupled between the capacitor C1 and the first input end IT1, and controlled by the signal (the second bit line signal BLB) applied on the first output end OT1. The switches 131 and 132 are respectively formed by transistors M5 and M6. The transistors M5 and M6 may be P-type MOS transistors.

Figure 3:
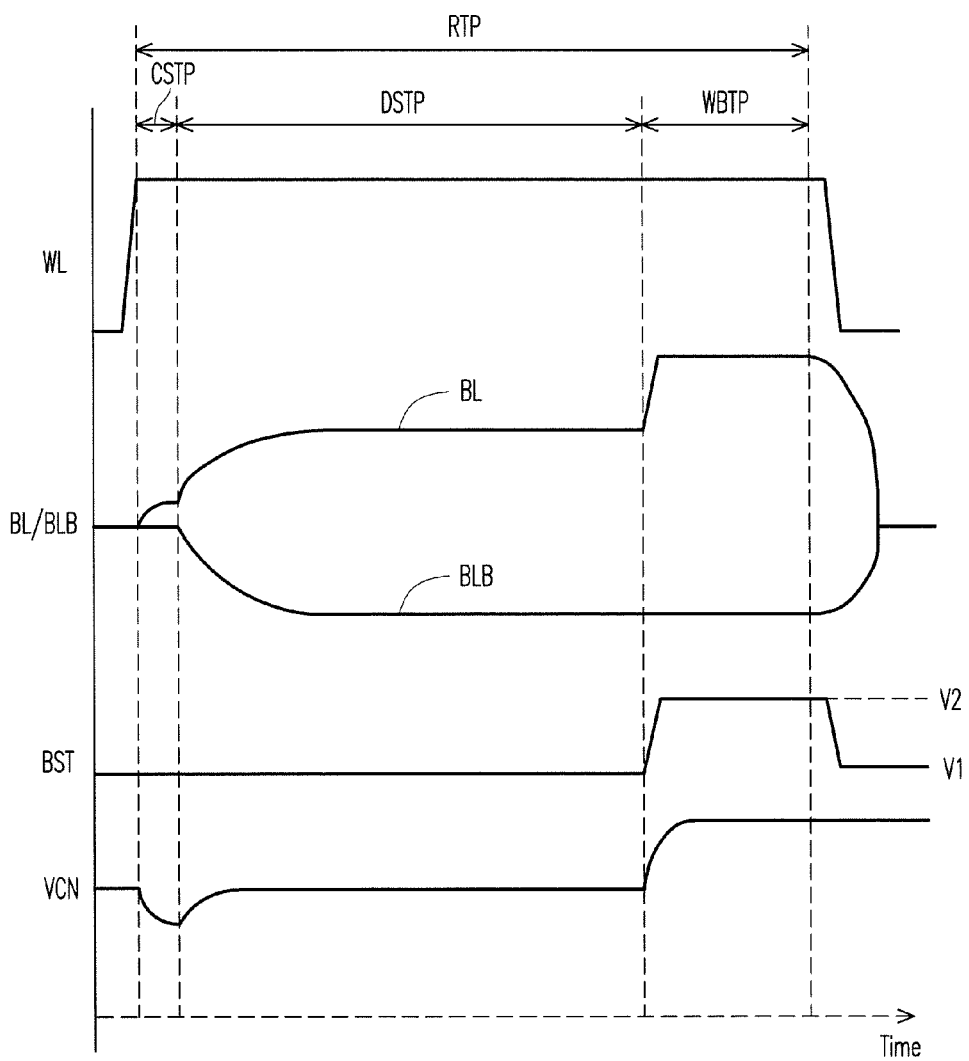
FIG. 3 is a waveform plot of the sense amplifier during a reading timing period according to an embodiment of the present disclosure.

About the detail operation of the sense amplifier 100 is shown as below. Referring to FIG. 2 and FIG. 3, wherein FIG. 3 is a waveform plot of the sense amplifier during a reading timing period according to an embodiment of the present disclosure. During the reading timing period RTP, a memory cell is selected for read. A word line signal WL is set to an active voltage level (such as high voltage level). During a charge sharing timing period CSTP of the reading timing period RTP, the first and second power path switches PSW1-

PSW2 are cut off according to the sense enable signal SEN and the inverted sense enable signal SENB, the switches 131 and 132 are cut-off, and a charge sharing operation is operated on the first and second input ends IT1 and IT2. Such as that, a voltage level of one of the first and second bit line signals BL and BLB is increased slightly. For example, the voltage level the first bit line signal BL is increased to a voltage level ΔV. Furthermore, a voltage level VCN on a node of the memory cell may be decreased slightly.

After the charge sharing timing period CSTP, during a data sensing timing period DSTP, the voltage levels of the first and second bit line signals are varied according to data stored in the selected memory cell. The first and second power path switches PSW1-PSW2 are turned on. In FIG. 3, the first bit line signal BL is rising to a high voltage level, and the second bit line signal BLB is rising to a low voltage level. During the data sensing timing period DSTP, when a voltage difference between the first and second bit line signal BL and BLB is larger than a threshold value, the data stored in the selected memory cell can be obtained.

It should be noted here, when the voltage level of the first bit line signal BL is larger than a threshold value of the transistor M5 may be turned on. On the contrary, the transistor M6 is cut off because of the second bit line signal BLB is smaller than a threshold value of the transistor M6.

After the data sensing timing period DSTP, the first and second power path switches PSW1-PSW2 are cut off. During the write-back timing period WBTP, the voltage level of the boost signal BST is boosted from a first voltage level V1 to a second voltage level V2, wherein the second voltage level V2 is larger than the first voltage level V1. Based on the voltage variation of the boost signal BST, the boosted voltage BTV can be obtained through the capacitor C1. Since the transistor M5 is turned at this time, the boosted voltage BTV with higher voltage level may be transported to the first bit line signal BL through the switch 131. That is, the voltage level VCN on the node of the memory cell may be written back to a higher voltage level. In this embodiment, if the boost signal BST is boosted from the reference ground VSS (V1=VSS) to the operation power VDD (V2=VDD), the voltage level VCN may be written back to VDD+ΔV during the write-back timing period WBTP.

On another case, if the second bit line signal BLB is rising to high voltage level, and the first bit line signal BL during the data sensing timing period DSTP, the transistor M6 is turned on and the transistor M5 is cut off. That is, the boosted voltage BTV can be transported to the second bit line signal BLB through the transistor 132. The memory cell also can be re-charged by receiving the boosted voltage BTV through the second bit line signal BLB.

It can be easily known, the charge in the memory cell can be re-charged during the write-back timing period WBTP. Further, the write-back operation is operated automatically according to the voltages on the first and second bit line signals BL and BLB. No more hardware for the write-back operation is needed in present disclosure.

Please be noted here, the sense amplifier 100 can also be operated efficiency with a lower operating power VDD (ex. VDD may be set between 0.5~0.9V), and the word line signal WL and the bit line signals BL, BLB are operated in the lower operating power scheme.

In summary, the present disclosure provides the sense amplifier may operate the write-back operation on the memory cell after the data sensing timing period during the read timing period. That is, charge loss in the selected memory cell can be prevented, and data retention for the memory cell can be improved. Such as that, the memory cell can be operated well with the operation power with low voltage by using the write-back scheme of present disclosure.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A sense amplifier, comprising:
   a first inverting circuit, having a first input end and a first output end, and the first input end receiving a first bit line signal from a memory cell;
   a second inverting circuit, having a second input end and a second output end, wherein the second input is coupled to the first output end, and the second output end is coupled to the first input end, and the second input end receives a second bit line signal from the memory cell;
   a capacitor, receiving a boost signal and generating a boosted voltage according to the boost signal during a write-back timing period;
   a write-back path circuit, coupled to the capacitor and transporting the boosted voltage to one of the first and second input ends during the write-back timing period according to the first and second bit line signals,
   wherein the write-back path circuit comprises:
      a first switch, coupled between the capacitor and the second input end, and being controlled by the first bit line signal to be turned on or cut off; and
      a second switch, coupled between the capacitor and the first input end, and being controlled by the second bit line signal to be turned on or cut off.

2. The sense amplifier according to claim 1, wherein the first bit line signal and the second bit line signal are complementary during the write-back timing period, and on-off status of the first and second switches are complementary during the write-back timing period.

3. The sense amplifier according to claim 1, wherein the first switch comprises:
   a first transistor, having a first end, second end, and control end, wherein the first end of the first transistor receives the boosted voltage, the second end of the first transistor is coupled to the second input end, and the control end of the first transistor receives the first bit line signal; and
   the second switch comprises:
   a second transistor, having a first end, second end, and control end, wherein the first end of the second transistor receives the boosted voltage, the second end of the second transistor is coupled to the first input end, and the control end of the first transistor receives the second bit line signal.

4. The sense amplifier according to claim 3, further comprising:
   a first power path switch, coupled between ground ends of the first and second inverting circuit and a reference ground, and being controlled by a sense enable signal for being turned on or cut off; and
   a second power path switch, coupled between power receiving ends of the first and second inverting circuit and an operation power, and being controlled by an inverted sense enable signal for being turned on or cut off.

5. The sense amplifier according to claim 4, wherein during a charge sharing timing period of a reading timing period, the first and second power path switches and the first and second switches are cut off, during a data sensing timing period of the reading timing period, the first and second power path switches are turned on and merely one of the first and second switches is turned on, during the write-back timing period of the reading timing period, the first and second power path switches are cut off, and the boosted voltage is provided to one of the first and second bit line signal to be written back to the memory cell.

6. The sense amplifier according to claim 5, wherein the charge sharing timing period is before the data sensing timing period, and the data sensing timing period is before the write-back timing period.

7. The sense amplifier according to claim 1, wherein a voltage level of the boost signal is boosted from a first voltage to a second voltage level during the wire-back timing period, wherein the second voltage level is larger than the first voltage level.

8. The sense amplifier according to claim 1, wherein the first inverting circuit comprises:
   a first transistor, having a first end, second end, and a control end, wherein the first end of the first transistor receives an operation power, the second end of the first transistor is coupled to the first output end, and the control end of the first transistor is coupled to the first input end; and
   a second transistor, having a first end, second end, and a control end, wherein the first end of the second transistor is coupled to the second end of the first transistor, the second end of the second transistor is coupled to a reference ground, and the control end of the second transistor is coupled to the first input end; and
the second inverting circuit comprises:
   a third transistor, having a first end, second end, and a control end, wherein the first end of the third transistor receives the operation power, the second end of the third transistor is coupled to the second output end, and the control end of the third transistor is coupled to the second input end; and
   a fourth transistor, having a first end, second end, and a control end, wherein the first end of the fourth transistor is coupled to the second end of the third transistor, the second end of the fourth transistor is coupled to the reference ground, and the control end of the fourth transistor is coupled to the second input end.

9. The sense amplifier according to claim 1, wherein an operating power of the sense amplifier is set between 0.5~0.9 volt.

* * * * *